United States Patent
Suzuki et al.

(10) Patent No.: US 11,916,285 B2
(45) Date of Patent: Feb. 27, 2024

(54) WIRING BOARD AND METHOD FOR MANUFACTURING WIRING BOARD

(71) Applicant: Dai Nippon Printing Co., Ltd., Tokyo (JP)

(72) Inventors: Koichi Suzuki, Tokyo (JP); Seiji Take, Tokyo (JP); Daisuke Matsuura, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 367 days.

(21) Appl. No.: 17/280,279

(22) PCT Filed: Sep. 19, 2019

(86) PCT No.: PCT/JP2019/036679
§ 371 (c)(1),
(2) Date: Mar. 26, 2021

(87) PCT Pub. No.: WO2020/066817
PCT Pub. Date: Apr. 2, 2020

(65) Prior Publication Data
US 2022/0037777 A1 Feb. 3, 2022

(30) Foreign Application Priority Data
Sep. 28, 2018 (JP) .................. 2018-186161

(51) Int. Cl.
*H05K 1/09* (2006.01)
*H05K 3/10* (2006.01)
(Continued)

(52) U.S. Cl.
CPC .............. *H01Q 1/38* (2013.01); *H05K 1/0274* (2013.01); *H05K 1/0296* (2013.01); *H05K 1/09* (2013.01);
(Continued)

(58) Field of Classification Search
CPC .......................... H05K 1/09–097; H05K 3/10
See application file for complete search history.

(56) References Cited

U.S. PATENT DOCUMENTS 8,570,225 B2  10/2013  Shoji et al.
2011/0001578 A1  1/2011  Jibu et al.
(Continued)

FOREIGN PATENT DOCUMENTS

JP  2006-196656 A  7/2006
JP  2011-066610 A1  3/2011
(Continued)

OTHER PUBLICATIONS

English translation of the International Preliminary Report on Patentability (Chapter 1) (Application No. PCT/JP2019/036679) dated Apr. 8, 2021.
(Continued)

*Primary Examiner* — Jeremy C Norris
(74) *Attorney, Agent, or Firm* — BURR PATENT LAW, PLLC

(57) ABSTRACT

A wiring board (10) includes a substrate (11) that is transparent and a wiring pattern region (20) that is disposed on the substrate (11) and that includes a plurality of wiring lines (21, 22). The wiring pattern region (20) has a sheet resistance of less than or equal to 5 Ω/sq, and each wiring line (21, 22) has a maximum width of less than or equal to 3 μm when viewed at a viewing angle of 120°.

12 Claims, 14 Drawing Sheets

(51) Int. Cl.
*H01Q 1/38* (2006.01)
*H05K 1/02* (2006.01)

(52) U.S. Cl.
CPC ..... *H05K 3/10* (2013.01); *H05K 2201/10098* (2013.01)

(56) References Cited

U.S. PATENT DOCUMENTS

2015/0334837 A1 11/2015 Nishida et al.
2018/0046283 A1 2/2018 Yoshida et al.

FOREIGN PATENT DOCUMENTS

| JP | 5636735 B2 | 12/2014 |
| JP | 5695947 B2 | 4/2015 |
| JP | 2017-175540 A | 9/2017 |

OTHER PUBLICATIONS

International Search Report and Written Opinion (Application No. PCT/JP2019/036679) dated Nov. 12, 2019.
Extended European Search Report dated Jun. 28, 2022 (Application No. 19866863.4).
Chinese Office Action (with English translation) dated Aug. 23, 2023 (Application No. 201980063043.5).
Chinese Office Action (with English translation), Chinese Application No. 201980063043.5, dated Dec. 14, 2023 (12 pages).

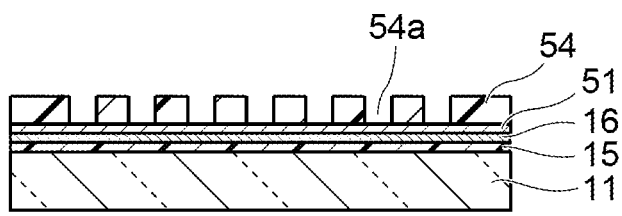
FIG. 11A
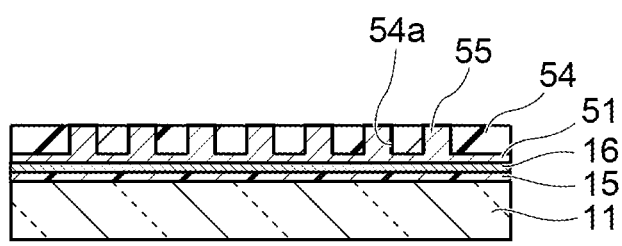
FIG. 11B
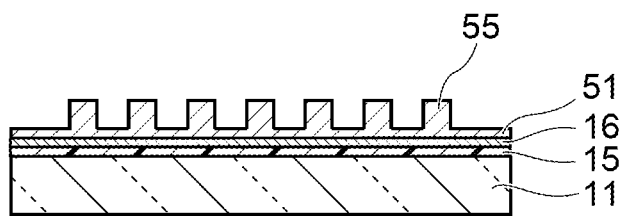
FIG. 11C
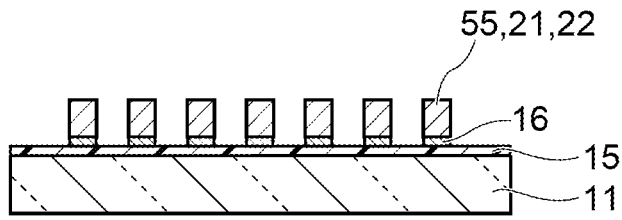
FIG. 11D
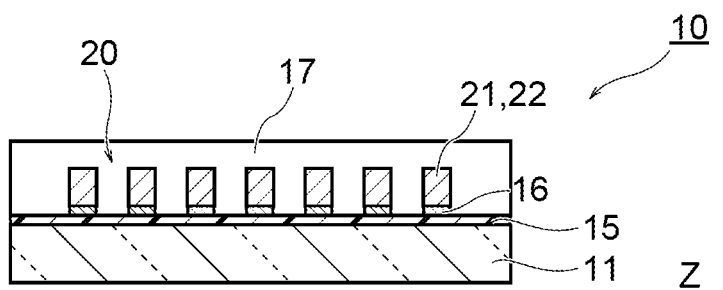
FIG. 11E
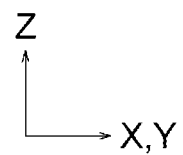

WIRING BOARD AND METHOD FOR MANUFACTURING WIRING BOARD

TECHNICAL FIELD

An embodiment of the present disclosure relates to a wiring board and a method for manufacturing the wiring board.

BACKGROUND ART

Presently, smaller, thinner, and lighter portable terminal devices, such as smartphones and tablets, with higher functionality are being developed. These portable terminal devices use a plurality of communication bands, and therefore require a plurality of antennas corresponding to the communication bands. For example, a portable terminal device may include a plurality of antennas including a telephone antenna, a wireless fidelity (WiFi) antenna, a third generation (3G) antenna, a fourth generation (4G) antenna, a long term evolution (LTE) antenna, a Bluetooth (registered trademark) antenna, and a near field communication (NFC) antenna. However, to reduce the size of the portable terminal device, the space in which the antennas are arranged is limited, and the design flexibility of the antennas is reduced. In addition, since the antennas are arranged in a limited space, the radio wave sensitivity is not always satisfactory.

Accordingly, film antennas mountable in a display region of a portable terminal device have been developed. A film antenna is a transparent antenna including a transparent base material on which an antenna pattern is formed. The antenna pattern is formed of a conductor mesh layer having a mesh structure, which includes a conductor portion composed of an opaque conductor layer and a plurality of openings in which no conductor layer is formed.

CITATION LIST

Patent Literature

PTL 1: Japanese Unexamined Patent Application Publication No. 2011-66610
PTL 2: Japanese Patent No. 5636735
PTL 3: Japanese Patent No. 5695947

The film antenna according to the related art includes a transparent base material on which a wiring pattern region (conductor mesh layer) is provided. The wiring pattern region may be readily visible to the naked eye depending on the mesh shape of the wiring pattern region.

The present embodiment provides a wiring board having a wiring pattern region that is not readily visible to the naked eye and a method for manufacturing the wiring board.

DISCLOSURE OF INVENTION

A wiring board according to the present embodiment includes a substrate that is transparent and a wiring pattern region that is disposed on the substrate and that includes a plurality of wiring lines. The wiring pattern region has a sheet resistance of less than or equal to 5 Ω/sq. Each wiring line has a maximum width of less than or equal to 3 μm when viewed at a viewing angle of 120°.

The wiring board according to the present embodiment may be configured such that each wiring line has a cross section in which a smaller of a height and a line width of the wiring line is less than or equal to twice a skin depth of the wiring line.

The wiring board according to the present embodiment may be configured such that at least one of the wiring lines has an aspect ratio of greater than or equal to 0.5.

The wiring board according to the present embodiment may be configured such that the wiring lines each include a top surface, a bottom surface, and a pair of side surfaces located between the top surface and the bottom surface. The pair of side surfaces of at least one of the wiring lines may be curved so that a width of the at least one of the wiring lines decreases toward the bottom surface in a region adjacent to the bottom surface.

The wiring board according to the present embodiment may be configured such that the wiring lines each include a top surface, a bottom surface, and a pair of side surfaces located between the top surface and the bottom surface. The pair of side surfaces of at least one of the wiring lines may be curved so that a width of the at least one of the wiring lines decreases toward the bottom surface in a region adjacent to the bottom surface, and at least one of the pair of side surfaces of at least another one of the wiring lines may be tapered in a region adjacent to the bottom surface.

The wiring board according to the present embodiment may be configured such that the wiring lines each include a top surface, a bottom surface, and a pair of side surfaces located between the top surface and the bottom surface. The top surface of at least one of the wiring lines may project in a direction away from the substrate.

The wiring board according to the present embodiment may be configured such that a highly adhesive layer is formed on the substrate.

The wiring board according to the present embodiment may be configured such that an adhesion enhancing layer is formed on the highly adhesive layer.

The wiring board according to the present embodiment may be configured such that a protective layer is formed on the substrate so as to cover the wiring lines.

The wiring board according to the present embodiment may be configured such that the wiring pattern region has a function of an antenna.

The wiring board according to the present embodiment may be configured such that a plurality of the wiring pattern regions are provided, and a longitudinal direction of one or more of the wiring pattern regions differs from a longitudinal direction of another one or more of the wiring pattern regions.

A method for manufacturing a wiring board according to the present embodiment includes a step of preparing a substrate that is transparent; and a step of forming a wiring pattern region including a plurality of wiring lines on the substrate. The wiring pattern region has a sheet resistance of less than or equal to 5 Ω/sq, and each wiring line has a maximum width of less than or equal to 3 μm when viewed at a viewing angle of 120°.

According to the embodiment of the present disclosure, the wiring pattern region is not readily visible to the naked eye.

BRIEF DESCRIPTION OF DRAWINGS

FIGS. 11A to 11E are sectional views illustrating the method for manufacturing the wiring board according to the embodiment.

DESCRIPTION OF EMBODIMENTS

An embodiment will be described with reference to FIGS. 1 to 12. FIGS. 1 to 12 illustrate the present embodiment.

Drawings described below are schematic diagrams. Therefore, sizes and shapes of the components are exaggerated as appropriate to facilitate understanding. Changes are possible as appropriate without departing from the technical idea. In each of the drawings described below, the same parts are denoted by the same reference signs, and detailed description thereof may be omitted. The numerical values of, for example, the dimensions and the materials of components described in this specification are examples of the embodiment. The numerical values and materials are not limited to the examples, and may be selected as appropriate. In this specification, terms relating to shapes and geometric conditions, such as "parallel", "orthogonal", and "perpendicular", are to be interpreted not only in a strict sense but also to cover states that are substantially the same as those in a strict sense.

In the embodiment described below, an "X direction" is a direction parallel to one side of a substrate. A "Y direction" is a direction perpendicular to the X direction and parallel to another side of the substrate. A "Z direction" is a direction perpendicular to both the X direction and the Y direction and parallel to a thickness direction of a wiring board. A "front surface" is a surface that is at the positive side in the Z direction and on which wiring lines are provided on the substrate. A "back surface" is a surface that is at the negative side in the Z direction and that is opposite to the surface on which the wiring lines are provided on the substrate.

[Structure of Wiring Board]

The structure of a wiring board according to the present embodiment will be described with reference to FIGS. 1 to 5. FIGS. 1 to 5 illustrate the wiring board according to the present embodiment.

Figure 1:
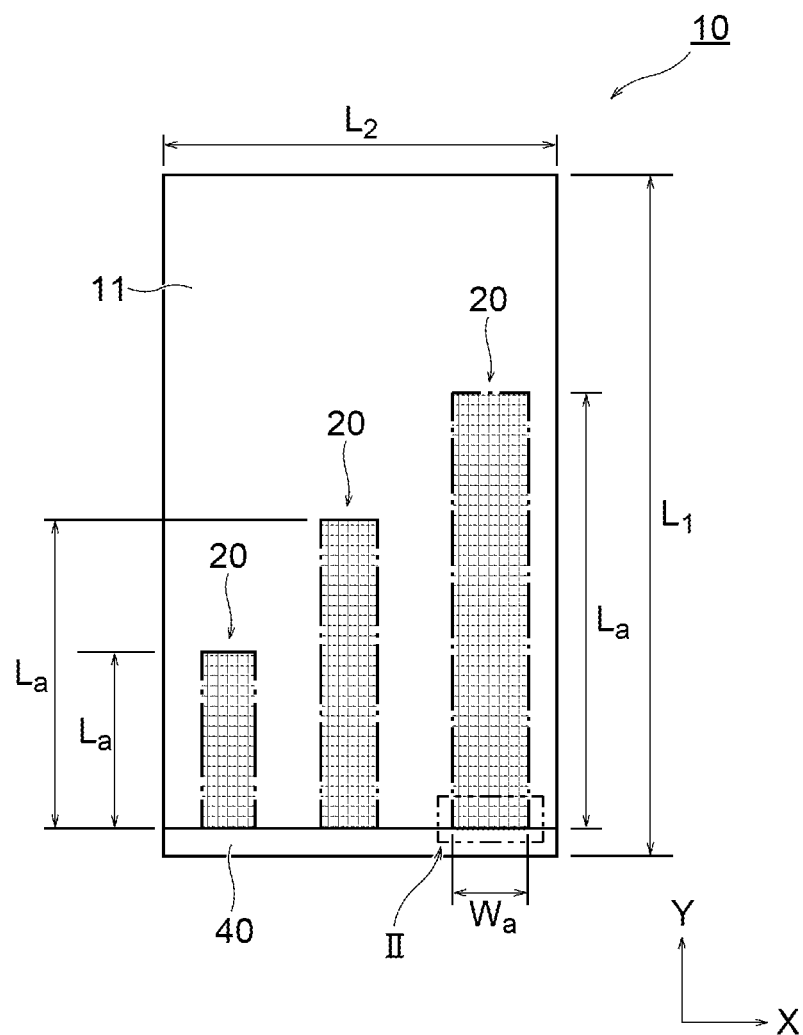
FIG. 1 is a plan view of a wiring board according to an embodiment.

As illustrated in FIG. 1, a wiring board 10 according to the present embodiment is disposed on, for example, a display of an image display device. The wiring board 10 includes a transparent substrate 11 and wiring pattern regions 20 arranged on the substrate 11. The wiring pattern regions 20 are electrically connected to a feeding unit 40.

The substrate 11 is substantially rectangular in plan view. The longitudinal direction of the substrate 11 is parallel to the Y direction, and the transverse direction of the substrate 11 is parallel to the X direction. The substrate 11, which is transparent, is substantially flat plate-shaped, and has a substantially uniform thickness over the entirety thereof. A length $L_1$ of the substrate 11 in the longitudinal direction (Y direction) may be selected from the range of, for example, greater than or equal to 100 mm and less than or equal to 200 mm, and a length $L_2$ of the substrate 11 in the transverse direction (X direction) may be selected from the range of, for example, greater than or equal to 50 mm and less than or equal to 100 mm. The substrate 11 may have rounded corners.

The material of the substrate 11 may be any material that is transparent in the visible light range and that has electrically insulating properties. The material of the substrate 11 is polyethylene terephthalate in the present embodiment, but is not limited to this. The material of the substrate 11 is preferably an organic insulating material, for example, a polyester-based resin such as polyethylene terephthalate, an acrylic resin such as polymethyl methacrylate, a polycarbonate-based resin, a polyimide-based resin, a polyolefin-based resin such as cycloolefin polymer, or a cellulose-based resin material such as triacetyl cellulose. The material of the substrate 11 may instead be glass, ceramic, etc., as appropriate depending on the use. Although the substrate 11 is composed of a single layer in the illustrated example, the substrate 11 is not limited to this, and may instead have a multilayer structure including a plurality of base materials or layers. The substrate 11 may be film-shaped or plate-shaped. Thus, the thickness of the substrate 11 is not particularly limited, and may be selected as appropriate depending on the use. For example, a thickness (in the Z direction) $T_1$ of the substrate 11 (see FIGS. 4 and 5) may be in the range of, for example, greater than or equal to 10 μm and less than or equal to 200 μm.

In the present embodiment, the wiring pattern regions 20 are composed of antenna pattern regions having a function of an antenna. In FIG. 1, the wiring pattern regions 20 (three in number), which are formed on the substrate 11, correspond to different frequency bands. More specifically, the wiring pattern regions 20 have different lengths (lengths in the Y direction) $L_a$, each of which corresponds to a specific frequency band. The wiring pattern regions 20 corresponding to frequency bands with lower frequencies have longer lengths $L_a$. When, for example, the wiring board 10 is disposed on a display 91 of an image display device 90 (see FIG. 12 described below), each wiring pattern region 20 may correspond to, for example, a telephone antenna, a WiFi antenna, a 3G antenna, a 4G antenna, an LTE antenna, a Bluetooth (registered trademark) antenna, or an NFC antenna.

Each wiring pattern region 20 is substantially rectangular in plan view. The longitudinal direction of each wiring pattern region 20 is parallel to the Y direction, and the transverse direction (width direction) of each wiring pattern region 20 is parallel to the X direction. The length $L_a$ of each wiring pattern region 20 in the longitudinal direction (Y direction) may be selected from the range of, for example, greater than or equal to 3 mm and less than or equal to 100 mm. As described below, a width $W_a$ of each wiring pattern region 20 in the transverse direction (width direction) is determined in consideration of factors including: (i) skin depths of first-direction wiring lines 21 and second-direction wiring lines 22; (ii) sheet resistance of the wiring pattern region 20; and (iii) viewing angles of the first-direction wiring lines 21 and the second-direction wiring lines 22. Specifically, the width $W_a$ of each wiring pattern region 20 may be selected from the range of, for example, greater than or equal to 1 mm and less than or equal to 25 mm.

Each wiring pattern region 20 includes metal lines that form a grid structure or a mesh structure having a pattern periodic in the X direction and the Y direction. In other words, each wiring pattern region 20 has a pattern including portions extending in the X direction (second-direction wiring lines 22) and portions extending in the Y direction (first-direction wiring lines 21).

Figure 2:
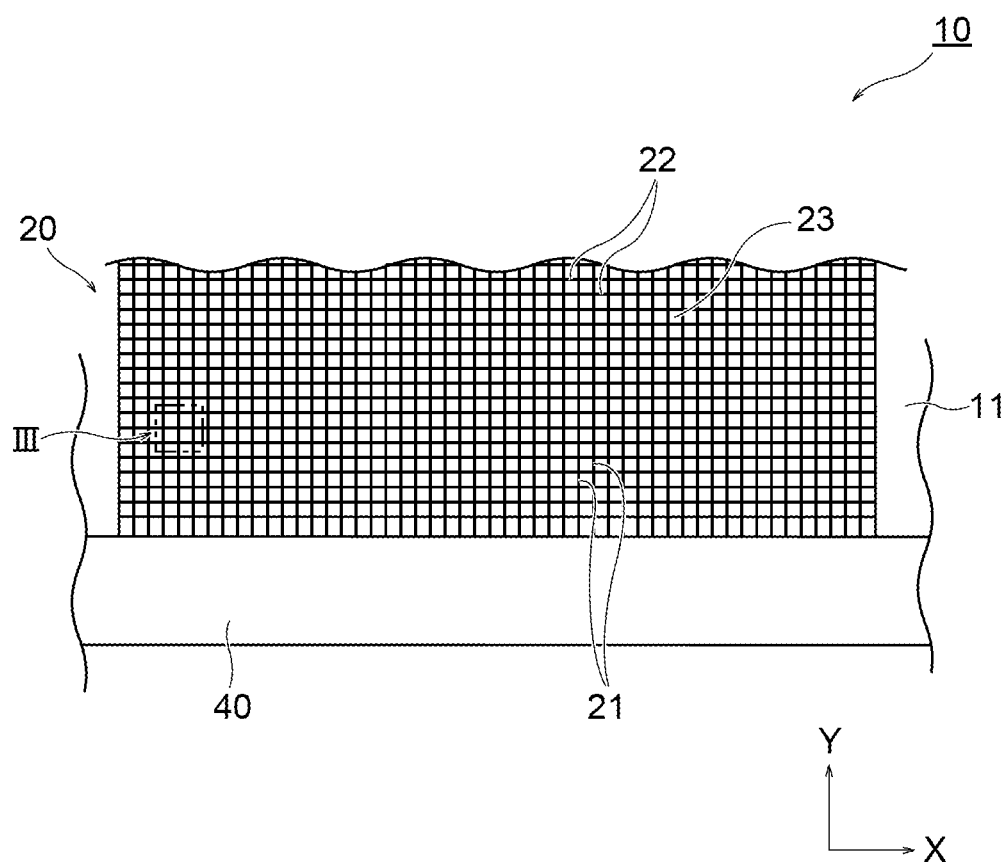
FIG. 2 is an enlarged plan view of the wiring board according to the embodiment (enlarged view of part II in FIG. 1).

As illustrated in FIG. 2, each wiring pattern region 20 includes the first-direction wiring lines (antenna wiring lines) 21 that provide the function of an antenna and the second-direction wiring lines (antenna-connecting wiring lines) 22 that connect the first-direction wiring lines 21. More specifically, the first-direction wiring lines 21 and the second-direction wiring lines 22 are integrated together to form a grid structure or a mesh structure. Each first-direction wiring line 21 extends in a direction corresponding to the frequency band of the antenna (longitudinal direction, Y direction), and each second-direction wiring line 22 extends in a direction orthogonal to the first-direction wiring lines 21 (width direction, X direction). The first-direction wiring lines 21 have the length $L_a$ corresponding to a predetermined frequency band (above-described length of the wiring pattern region 20, see FIG. 1) to mainly provide the function of an antenna. The second-direction wiring lines 22 connect the first-direction wiring lines 21 to each other to prevent a defect such as breakage of the first-direction wiring lines 21 or electrical disconnection between each first-direction wiring line 21 and the feeding unit 40.

Each wiring pattern region 20 has a plurality of openings 23 that are each surrounded by adjacent ones of the first-direction wiring lines 21 and adjacent ones of the second-direction wiring lines 22. The openings 23 are substantially rectangular or square in plan view, and have the same areas. The transparent substrate 11 is exposed at each opening 23. Therefore, the overall transparency of the wiring board 10 can be increased by increasing the total area of the openings 23 per unit area of the wiring pattern region 20.

Figure 3:
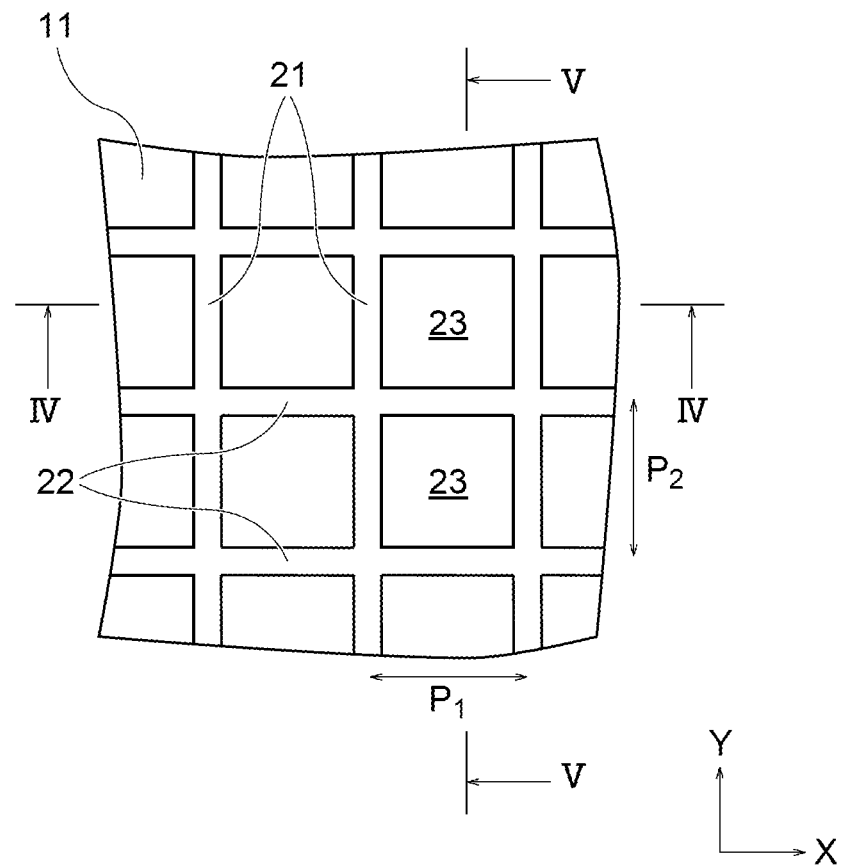
FIG. 3 is an enlarged plan view of the wiring board according to the embodiment (enlarged view of part III in FIG. 2).

As illustrated in FIG. 3, the first-direction wiring lines 21 are arranged with intervals therebetween (at pitch $P_1$) in the width direction of the wiring pattern region 20 (X direction). The first-direction wiring lines 21 are arranged at equal intervals in the width direction of the wiring pattern region 20 (X direction). As described below, the pitch $P_1$ of the first-direction wiring lines 21 is determined in consideration of factors including: (i) skin depth of the first-direction wiring lines 21; (ii) sheet resistance of the wiring pattern region 20; and (iii) viewing angle of the first-direction wiring lines 21. Specifically, the pitch $P_1$ of the first-direction wiring lines 21 may be in the range of, for example, greater than or equal to 0.01 mm and less than or equal to 1 mm. The pitch $P_1$ of the first-direction wiring lines 21 is constant in the width direction of the wiring pattern region 20 (X direction), but may instead vary in the width direction (X direction).

The second-direction wiring lines 22 are arranged at equal intervals in the longitudinal direction of the wiring pattern region 20 (Y direction). As described below, a pitch $P_2$ of the second-direction wiring lines 22 is determined in consideration of factors including: (i) skin depth of the second-direction wiring lines 22; (ii) sheet resistance of the wiring pattern region 20; and (iii) viewing angle of the second-direction wiring lines 22. Specifically, the pitch $P_2$ of the second-direction wiring lines 22 may be in the range of, for example, greater than or equal to 0.01 mm and less than or equal to 1 mm. Each first-direction wiring line 21 and each second-direction wiring line 22 are orthogonal to each other, but may instead cross each other at an acute or obtuse angle. The pitch $P_2$ of the second-direction wiring lines 22 is constant in the longitudinal direction of the wiring pattern region 20 (Y direction), but may instead vary in the longitudinal direction (Y direction). In addition, the pitch $P_1$ of the first-direction wiring lines 21 and the pitch $P_2$ of the second-direction wiring lines 22 are equal in the present embodiment, but may instead be different from each other.

Figure 4:
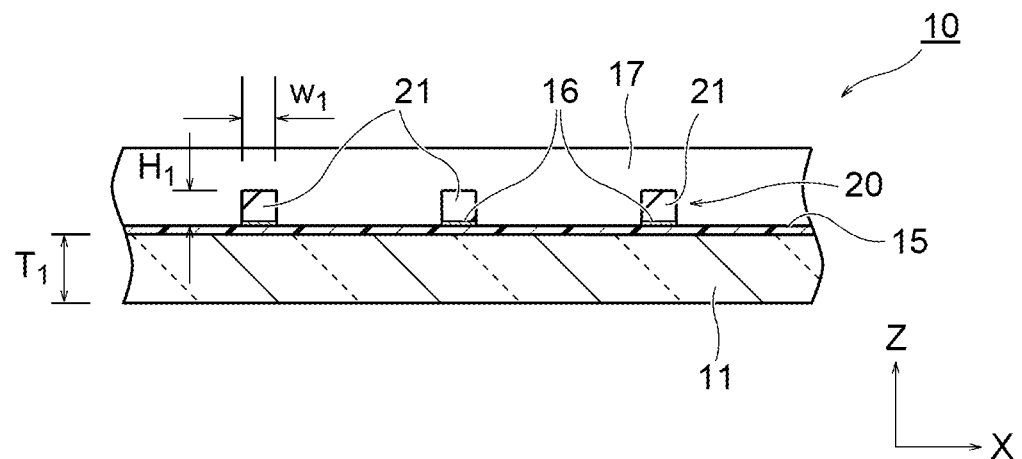
FIG. 4 is a sectional view of the wiring board according to the embodiment (sectional view of line VI-VI in FIG. 3).
Figure 5:
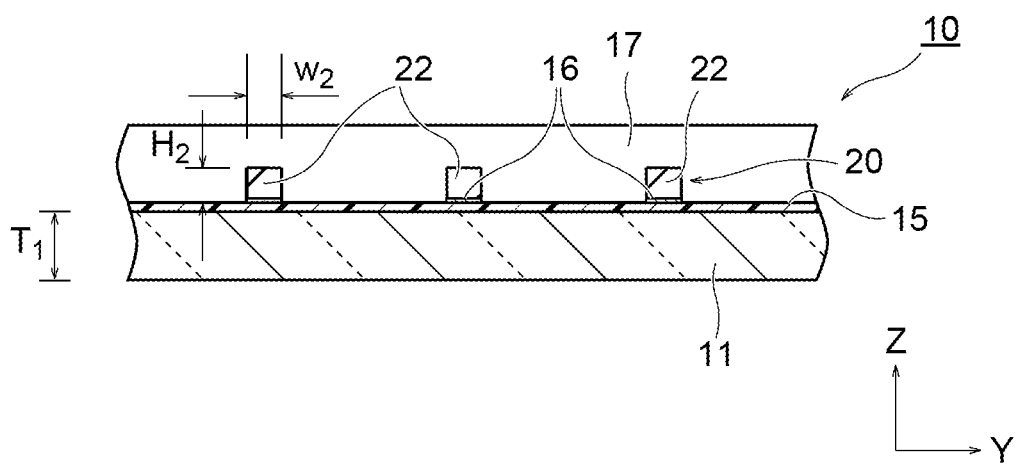
FIG. 5 is a sectional view of the wiring board according to the embodiment (sectional view of line V-V in FIG. 3).

As illustrated in FIG. 4, each first-direction wiring line 21 has a substantially rectangular or square cross section in a direction perpendicular to the longitudinal direction thereof (cross section in the X direction). The cross-sectional shape of each first-direction wiring line 21 is substantially uniform in the longitudinal direction of the first-direction wiring line 21 (Y direction). As illustrated in FIG. 5, each second-direction wiring line 22 has a substantially rectangular or square cross section in a direction perpendicular to the longitudinal direction thereof (cross section in the Y direction). The cross-sectional shape of each second-direction wiring line 22 is substantially the same as the above-described cross-sectional shape of each first-direction wiring line 21 (shape of cross section in the X direction). The cross-sectional shape of each second-direction wiring line 22 is substantially uniform in the longitudinal direction of the second-direction wiring line 22 (X direction). The cross-sectional shapes of each first-direction wiring line 21 and each second-direction wiring line 22 need not be substantially rectangular or square, and may instead be, for example, a substantially trapezoidal shape that is narrower at the front side (positive side in the Z direction) than at the back side (negative side in the Z direction), or a shape having curved side surfaces at both ends in the longitudinal direction.

In the present embodiment, as described below, a line width $W_1$ (dimension in the X direction, see FIG. 4) and a height $H_1$ (dimension in the Z direction, see FIG. 4) of the first-direction wiring lines 21 are determined in consideration of factors including: (i) skin depth of the first-direction wiring lines 21; (ii) sheet resistance of the wiring pattern region 20; and (iii) viewing angle of the first-direction wiring lines 21. For example, the line width $W_1$ of the first-direction wiring lines 21 may be selected from the range of greater than or equal to 0.1 μm and less than or equal to 3.0 μm, and the height $H_1$ of the first-direction wiring lines 21 may be selected from the range of, for example, greater than or equal to 0.1 μm and less than or equal to 3.0 μm.

Similarly, as described below, a line width $W_2$ (dimension in the Y direction, see FIG. 5) and a height $H_2$ (dimension in the Z direction, see FIG. 5) of the second-direction wiring lines 22 are determined in consideration of factors including: (i) skin depth of the second-direction wiring lines 22; (ii) sheet resistance of the wiring pattern region 20; and (iii) viewing angle of the second-direction wiring lines 22. For example, the line width $W_2$ of the second-direction wiring lines 22 may be selected from the range of greater than or equal to 0.1 μm and less than or equal to 3.0 μm, and the height $H_2$ of the second-direction wiring lines 22 may be selected from the range of, for example, greater than or equal to 0.1 μm and less than or equal to 3.0 μm.

As illustrated in FIGS. 4 and 5, a highly adhesive layer 15 is formed on the substrate 11. The highly adhesive layer 15, which increases adhesion between the substrate 11 and each of the first-direction wiring lines 21 and the second-direction wiring lines 22, is formed on the front surface of the substrate 11 over substantially the entire region thereof. The highly adhesive layer 15 is composed of an insulating film. The material of the highly adhesive layer 15 may be a colorless transparent resin, for example, an acrylic resin such as polymethyl (meth)acrylate, polyethyl (meth)acrylate, or a modified resin or copolymer thereof, a polyester, a polyvinyl resin such as polyvinyl alcohol, polyvinyl acetate, polyvinyl acetal, polyvinyl butyral, or a copolymer thereof, a polyurethane, an epoxy resin, a polyamide, or a chlorinated polyolefin. The thickness of the highly adhesive layer 15 may be set as appropriate in the range of greater than or equal to 10 nm and less than or equal to 800 nm. The highly adhesive layer 15 may be formed on the front surface of the substrate 11 at least over the wiring pattern region 20.

An adhesion enhancing layer 16 is formed on the highly adhesive layer 15. The adhesion enhancing layer 16 is located between the highly adhesive layer 15 and each of the first-direction wiring lines 21 and the second-direction wiring lines 22. The adhesion enhancing layer 16, which enhances the adhesion between the substrate 11 and each of the first-direction wiring lines 21 and the second-direction wiring lines 22, has the same shape as that of the first-direction wiring lines 21 and the second-direction wiring lines 22 in plan view. In other words, the adhesion enhancing layer 16 has a grid structure or a mesh structure in plan view. The material of the adhesion enhancing layer 16 may be, for example, titanium, titanium oxide, nickel, nickel oxide, or a metal oxide such as indium zinc oxide (IZO). The thickness of the adhesion enhancing layer 16 may be selected from the range of greater than or equal to 10 nm and less than or equal to 100 nm. It is not necessary that the adhesion enhancing layer 16 be provided.

A protective layer 17 is formed on the front surface of the substrate 11 so as to cover the first-direction wiring lines 21, the second-direction wiring lines 22, and the highly adhesive layer 15. The protective layer 17, which protects the first-direction wiring lines 21 and the second-direction wiring lines 22, is formed on the front surface of the substrate 11 over substantially the entire region thereof. The material of the protective layer 17 may be a colorless transparent insulating resin, for example, an acrylic resin such as polymethyl (meth)acrylate, polyethyl (meth)acrylate, or a modified resin or copolymer thereof, a polyester, a polyvinyl resin such as polyvinyl alcohol, polyvinyl acetate, polyvinyl acetal, polyvinyl butyral, or a copolymer thereof, a polyurethane, an epoxy resin, a polyamide, or a chlorinated polyolefin. The thickness of the protective layer 17 may be selected from the range of greater than or equal to 0.3 μm and less than or equal to 10 μm. The protective layer 17 may be formed on the substrate 11 to cover at least the wiring pattern region 20.

An overall opening ratio At of the wiring pattern region 20 may be in the range of, for example, greater than or equal to 87% and less than 100%. When the overall opening ratio At of the wiring board 10 is in this range, the wiring board 10 may be sufficiently conductive and transparent. The opening ratio is a ratio (%) of the area of the opening region (region in which metal portions, such as the first-direction wiring lines 21 and the second-direction wiring lines 22, are not present and in which the substrate 11 is exposed) to the unit area in a predetermined region (for example, the entire region of the wiring pattern region 20).

The material of the first-direction wiring lines 21 and the second-direction wiring lines 22 may be any metal material that is conductive. The material of the first-direction wiring lines 21 and the second-direction wiring lines 22 is copper in the present embodiment, but is not limited to this. Examples of the material of the first-direction wiring lines 21 and the second-direction wiring lines 22 include metal materials (including alloys), such as gold, silver, copper, platinum, tin, aluminum, iron, and nickel.

In the present embodiment, the mesh pattern (dimensions) of the first-direction wiring lines 21 and the second-direction wiring lines 22 of each wiring pattern region 20 is determined in consideration of factors including: (i) skin depths of the first-direction wiring lines 21 and the second-direction wiring lines 22; (ii) sheet resistance of the wiring pattern region 20; and (iii) viewing angles of the first-direction wiring lines 21 and the second-direction wiring lines 22. A method for determining the mesh pattern (dimensions) of each wiring pattern region 20 will now be described.

(i) Skin Depth

As described above, the length (length in Y direction) $L_a$ of each wiring pattern region 20 corresponds to a specific frequency band, and the wiring pattern regions 20 corresponding to frequency bands with lower frequencies have longer lengths $L_a$. The line widths $W_1$ and $W_2$ and the heights $H_1$ and $H_2$ of the first-direction wiring lines 21 and the second-direction wiring lines 22 are determined after the length $L_a$ of each wiring pattern region 20 is determined.

The line widths $W_1$ and $W_2$ and the heights $H_1$ and $H_2$ of the first-direction wiring lines 21 and the second-direction wiring lines 22 are set to dimensions at which no influence of skin effect occurs in accordance with the corresponding frequency band. More specifically, each first-direction wiring line 21 has a cross section in which the smaller of the height $H_1$ and the line width $W_1$ of the first-direction wiring line 21 is less than or equal to twice the skin depth of the first-direction wiring line 21, and each second-direction wiring line 22 has a cross section in which the smaller of the height $H_2$ and the line width $W_2$ of the second-direction wiring line 22 is less than or equal to twice the skin depth of the second-direction wiring line 22.

In general, when an alternating current is applied to a wiring line, the current is weakened in a central region of the wiring line as the frequency increases, and accordingly the current flows along the surface of the wiring line. The phenomenon that the alternating current applied to the wiring line flows only along the surface is referred to as a skin effect. The skin depth is a depth from the surface of the wiring line at which the current is reduced to 1/e (about 0.37) of the current along the surface of the wiring line, where the current most easily flows. The skin depth δ is generally determined by the following equation.

$$\delta = \sqrt{\frac{2}{\omega\mu\sigma}} \quad \text{[Math. 1]}$$

In the above equation, ω is an angular frequency (=2πf), μ is a magnetic permeability ($4\times10^{-7}$ [H/m] in vacuum), and σ is an electrical conductivity of the conductor that forms the wiring line ($5.8\times10^7$ [S/m] for copper). The skin depth δ of a copper wiring line is δ=about 2.3 μm when the frequency is 0.8 GHz, δ=about 1.3 μm when the frequency is 2.4 GHz, δ=about 1.0 μm when the frequency is 4.4 GHz, and δ=about 0.85 μm when the frequency is 6 GHz.

Figure 6:
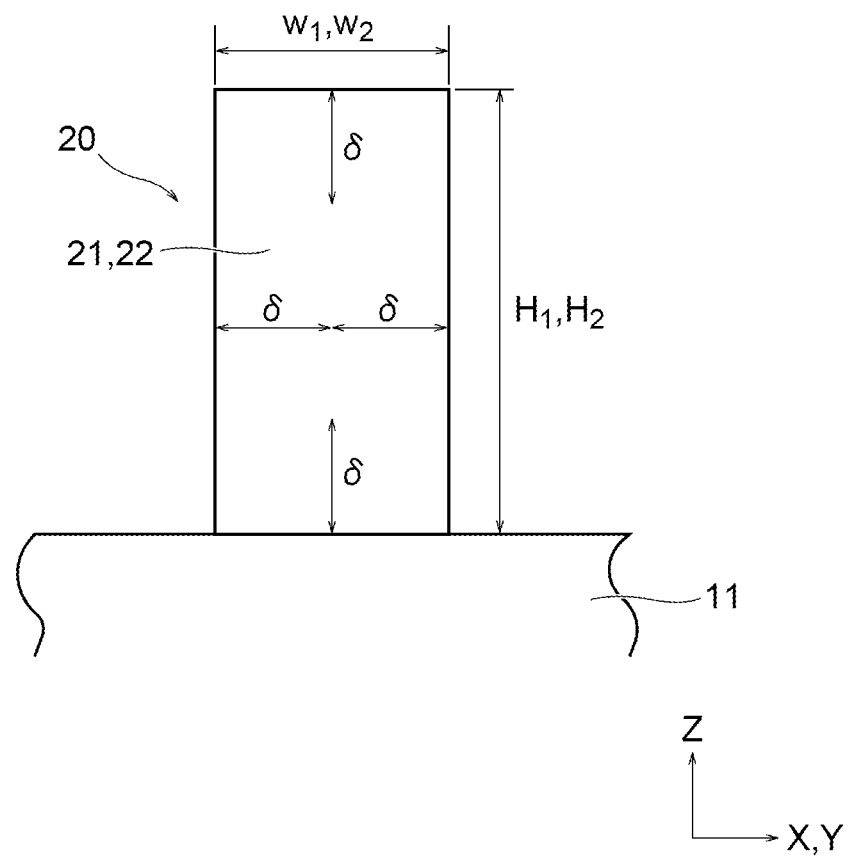
FIG. 6 is a sectional view of a wiring line.

In the present embodiment, the smaller of the height $H_1$ ($H_2$) and the line width $W_1$ ($W_2$) of each first-direction wiring line 21 (second-direction wiring line 22) is less than or equal to twice the skin depth δ at the corresponding frequency (2δ). For example, when the line width $W_1$ ($W_2$)

is less than the height $H_1$ ($H_2$) of each first-direction wiring line 21 (second-direction wiring line 22) as illustrated in FIG. 6 ($W_1<H_1$ ($W_2<H_2$)), the line width $W_1$ ($W_2$) of the first-direction wiring line 21 (second-direction wiring line 22) is set to less than or equal to twice the skin depth δ at the corresponding frequency ($W_1 \leq 2δ$ ($W_2 \leq 2δ$)). For example, when the frequency corresponding to the wiring pattern region 20 is 2.4 GHz, $W_1$ ($W_2$) is less than or equal to 2.6 μm. When the frequency corresponding to the wiring pattern region 20 is 6 GHz, $W_1$ ($W_2$) is less than or equal to 1.7 μm.

Accordingly, the current flows over substantially the entire region of the cross section of each first-direction wiring line 21 (second-direction wiring line 22). Therefore, the first-direction wiring line 21 (second-direction wiring line 22) can be efficiently utilized, and the cross-sectional area of the first-direction wiring line 21 (second-direction wiring line 22) can be minimized. As a result, the opening ratio At of the wiring pattern region 20 can be increased so that the wiring pattern region 20 is not readily visible to the naked eye.

(ii) Sheet Resistance

Each wiring pattern region 20 has a sheet resistance of less than or equal to 5 Ω/sq. When the sheet resistance is less than or equal to 5 Ω/sq, the wiring pattern region 20 has sufficient performance. More specifically, the radiation efficiency of the wiring pattern region 20 as an antenna (ratio of radiated power to electric power input to the wiring pattern region 20 alone) can be increased.

Figure 7:
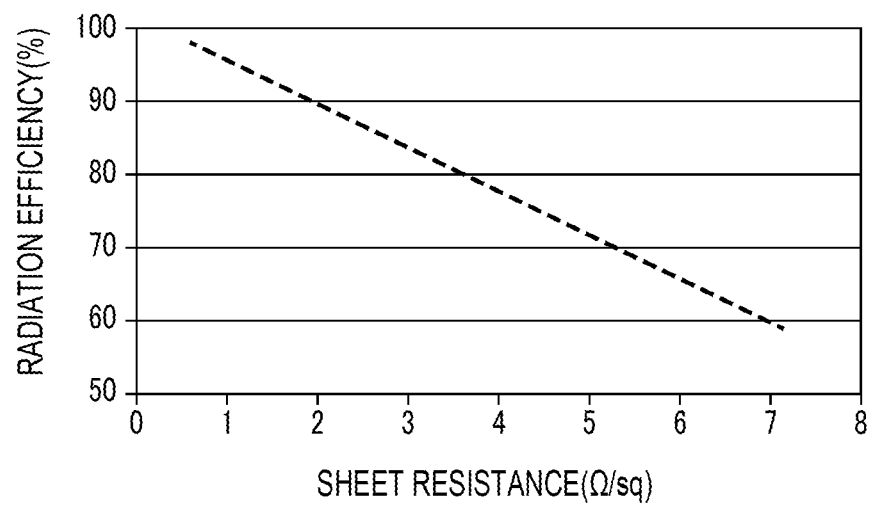
FIG. 7 is a graph showing the result of a simulation of the relationship between the sheet resistance and the radiation efficiency.
Figure 8:
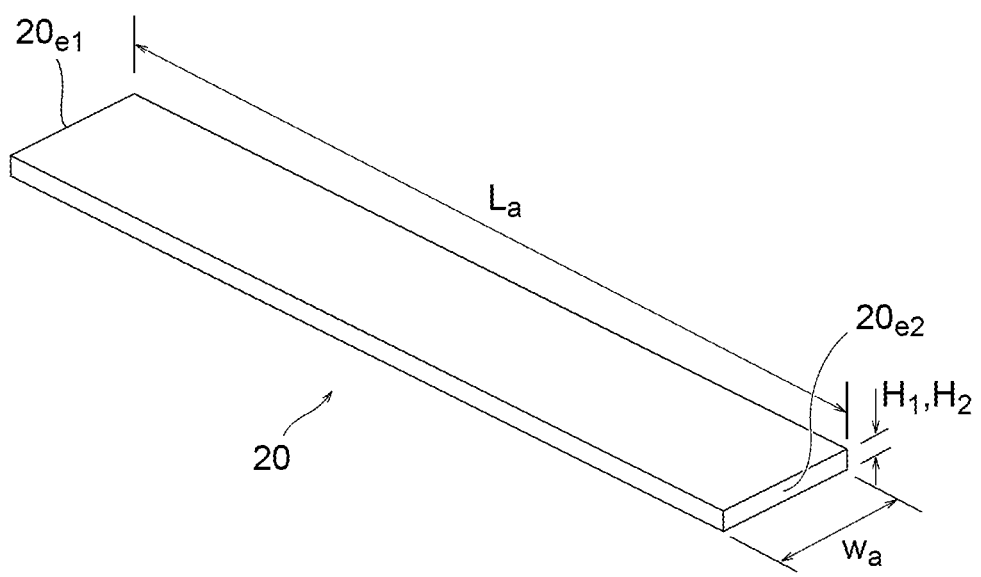
FIG. 8 is a perspective view of a wiring pattern region.

FIG. 7 shows the result of a simulation of the relationship between the sheet resistance and the radiation efficiency when the frequency corresponding to the wiring pattern region 20 that functions as an antenna is 2.4 GHz. It is clear from FIG. 7 that when the sheet resistance of the wiring pattern region 20 is less than or equal to 5 Ω/sq, the radiation efficiency of the wiring pattern region 20 alone is greater than or equal to 75%, and satisfactory antenna characteristics can be obtained. When the sheet resistance of the wiring pattern region 20 exceeds 5 Ω/sq, there is a risk that the radiation efficiency of the wiring pattern region 20 will be less than 75%. Also when the frequency corresponding to the wiring pattern region 20 is a frequency other than 2.4 GHz, satisfactory radiation efficiency can be achieved by setting the sheet resistance to less than or equal to 5 Ω/sq.

A method for determining the sheet resistance (Ω/sq) of the wiring pattern region 20 will now be described. A resistance R between both ends $20_{e1}$ and $20_{e2}$ (see FIG. 8) of the wiring pattern region 20 in the longitudinal direction (Y direction) is measured. Next, the resistance R is divided by the ratio of the length $L_a$ to the width $W_a$ of the wiring pattern region 20 ($L_a/W_a$) to determine the sheet resistance $R_s$ (Ω/sq) of the wiring pattern region 20. Namely, the sheet resistance $R_s$ is calculated as $R_s = R \times W_a/L_a$.

Thus, by setting the sheet resistance of the wiring pattern region 20 to less than or equal to 5 Ω/sq, the radiation efficiency of the wiring pattern region 20 alone can be set to greater than or equal to 75%, and the performance of the wiring pattern region 20 as an antenna can be improved. In addition, the width $W_a$ and the heights $H_1$ and $H_2$ of the wiring pattern region 20 can be minimized within the ranges in which the sheet resistance satisfies the above-described condition. Therefore, the opening ratio At of the wiring pattern region 20 can be increased so that the wiring pattern region 20 is not readily visible.

(iii) Viewing Angle

In addition, according to the present embodiment, the first-direction wiring lines 21 and the second-direction wiring lines 22 have a maximum width of less than or equal to 3 μm when viewed at a viewing angle of 120°.

Figure 9:
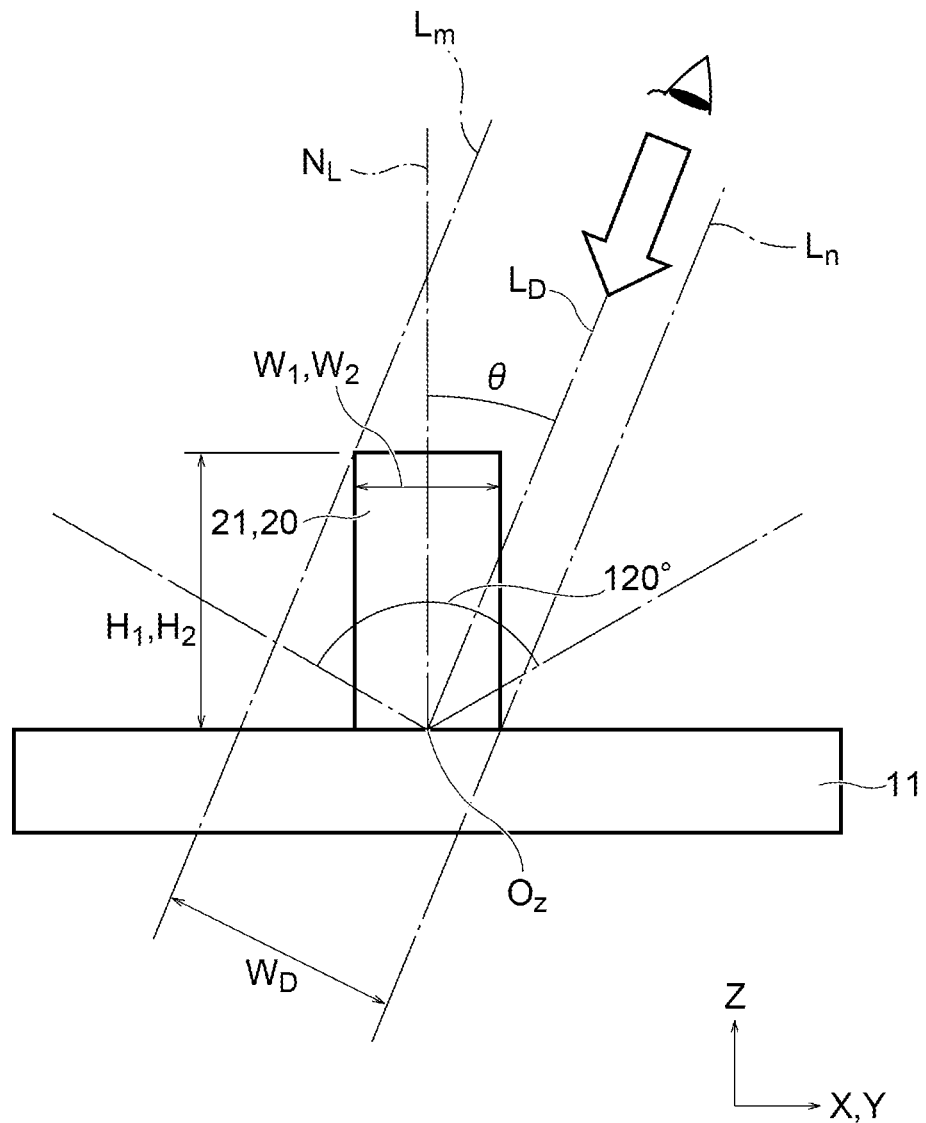
FIG. 9 is a sectional view of a wiring line.

More specifically, referring to FIG. 9, in a cross section perpendicular to the longitudinal direction of the first-direction wiring line 21 (second-direction wiring line 22), a width $W_D$ is determined as a width of the first-direction wiring line 21 (second-direction wiring line 22) when viewed in a direction of a certain line of sight $L_D$. When the line of sight $L_D$ is moved within a viewing angle of 120°, the maximum width of the first-direction wiring line 21 (second-direction wiring line 22) is less than or equal to 3 μm.

The viewing angle is defined as 2×θ when θ is an angle between a normal line $N_L$ that is perpendicular to the front surface of the substrate 11 and a line of sight $L_D$ directed toward an intersection $O_Z$ between the normal line $N_L$ and the front surface of the substrate 11. The width $W_D$ of the first-direction wiring line 21 (second-direction wiring line 22) when viewed in the direction of the line of sight $L_D$ is defined as the distance between a pair of straight lines $L_m$ and $L_n$ that are parallel to the line of sight $L_D$ and that are in contact with the first-direction wiring line 21 (second-direction wiring line 22) in cross-sectional view.

For example, in the case where the height $H_1$ ($H_2$) of the first-direction wiring line 21 (second-direction wiring line 22) and the line width $W_1$ ($W_2$) of the first-direction wiring line 21 (second-direction wiring line 22) are equal ($H_1 = W_1$ ($H_2 = W_2$)), the width $W_D$ is at a maximum and has a value of $1.41 \times W_1$ at θ=45° when viewed at a viewing angle of 120°. In the case where the height $H_1$ ($H_2$) of the first-direction wiring line 21 (second-direction wiring line 22) is twice the line width $W_1$ ($W_2$) of the first-direction wiring line 21 (second-direction wiring line 22) ($H_1 = 2 \times w_1$ ($H_2 = 2 \times W_2$)), the width $W_D$ is at a maximum and has a value of $2.23 \times W_1$ at θ=60° when viewed at a viewing angle of 120°.

The viewing angle of the wiring board 10 is generally considered to be about 120° at a maximum when viewed by a user. In addition, the first-direction wiring line 21 (second-direction wiring line 22) is visible to the human eye when the width thereof about 3 μm or greater. Therefore, in the case where the first-direction wiring line 21 (second-direction wiring line 22) has a maximum width of less than or equal to 3 μm when viewed at a viewing angle of 120°, the first-direction wiring line 21 (second-direction wiring line 22) is not readily visible to the user's naked eye.

Referring to FIG. 1 again, the feeding unit 40 is electrically connected to the wiring pattern regions 20. The feeding unit 40 is composed of a substantially rectangular thin plate-shaped conductive member. The longitudinal direction of the feeding unit 40 is parallel to the X direction, and the transverse direction of the feeding unit 40 is parallel to the Y direction. The feeding unit 40 is disposed at an end of the substrate 11 in the longitudinal direction of the substrate 11 (end at the negative side in the Y direction). Examples of the material of the feeding unit 40 include metal materials (including alloys), such as gold, silver, copper, platinum, tin, aluminum, iron, and nickel. The feeding unit 40 is electrically connected to a wireless communication circuit 92 of an image display device 90 (see FIG. 12) when the wiring board 10 is installed in the image display device 90. Although the feeding unit 40 is provided on the front surface of the substrate 11, the feeding unit 40 is not limited to this, and a portion or the entirety thereof may instead be located outside the peripheral edge of the substrate 11. When the feeding unit 40 is formed to be flexible, the feeding unit 40 may be formed to extend to a side surface or a back surface of the image display device 90 to provide electrical connection at the side surface or the back surface.

[Method for Manufacturing Wiring Board]

A method for manufacturing a wiring board according to the present embodiment will now be described with reference to FIGS. 10A to 10E and FIGS. 11A to 11E. FIGS. 10A to 10E and FIGS. 11A to 11E are sectional views illustrating the method for manufacturing the wiring board according to the present embodiment.

Figure 10A:
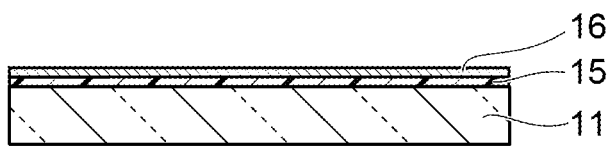
FIGS. 10A to 10E are sectional views illustrating a method for manufacturing the wiring board according to the embodiment.

First, as illustrated in FIG. 10A, the substrate 11 is prepared, and the highly adhesive layer 15 and the adhesion enhancing layer 16 are successively formed on the front surface of the substrate 11 over substantially the entire region thereof. The highly adhesive layer 15 may be formed by, for example, roll coating, gravure coating, gravure reverse coating, micro gravure coating, slot die coating, die coating, knife coating, inkjet coating, dispenser coating, kiss coating, or spray coating. The adhesion enhancing layer 16 may be formed by, for example, vapor deposition, sputtering, or plasma CVD.

Figure 10B:
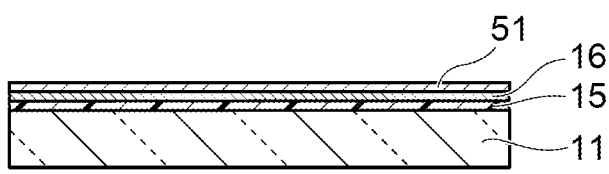

Next, as illustrated in FIG. 10B, a conductive layer 51 is formed on the adhesion enhancing layer 16 over substantially the entire region of the front surface of the substrate 11. In the present embodiment, the thickness of the conductive layer 51 is 200 nm. However, the thickness of the conductive layer 51 is not limited to this, and may be selected as appropriate from the range of greater than or equal to 10 nm and less than or equal to 1000 nm. In the present embodiment, the conductive layer 51 is formed by sputtering by using copper. The conductive layer 51 may instead be formed by, for example, plasma CVD.

Figure 10C:
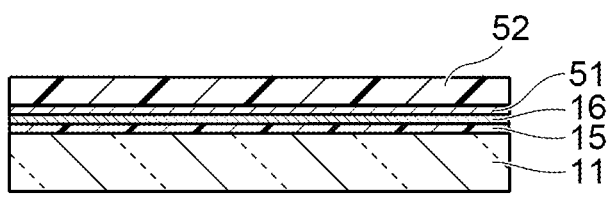

Next, as illustrated in FIG. 10C, a photocurable insulating resist 52 is applied to the adhesion enhancing layer 16 over substantially the entire region of the front surface of the substrate 11. The photocurable insulating resist 52 may be, for example, an organic resin, such as an epoxy-based resin.

Figure 10D:
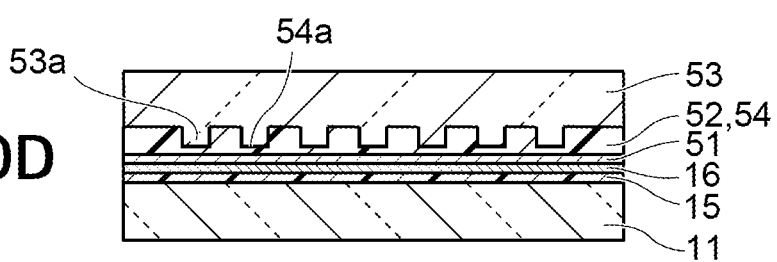

Subsequently, a transparent imprinting mold 53 having projections 53a is prepared (see FIG. 10D). This mold 53 is brought closer to the substrate 11 so that the photocurable insulating resist 52 spreads between the mold 53 and the substrate 11. Next, the photocurable insulating resist 52 is exposed to light through the mold 53 to cure the photocurable insulating resist 52, so that an insulating layer 54 is formed. Thus, trenches 54a having shapes obtained by transferring the shapes of the projections 53a are formed on the front surface of the insulating layer 54. The trenches 54a have a pattern corresponding to the first-direction wiring lines 21 and the second-direction wiring lines 22 in plan view.

Figure 10E:
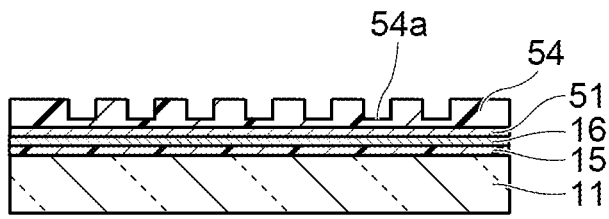

After that, the mold 53 is separated from the insulating layer 54, so that the insulating layer 54 having a cross-sectional structure illustrated in FIG. 10E is obtained. The direction in which the mold 53 is separated from the insulating layer 54 is preferably the Y direction in which the first-direction wiring lines 21, which are the longer wiring lines, extend.

Since the trenches 54a are formed on the front surface of the insulating layer 54 by imprinting, the trenches 54a can be formed in a fine shape. The method for forming the insulating layer 54 is not limited to this, and the insulating layer 54 may instead be formed by photolithography. In such a case, a resist pattern is formed by photolithography so that portions of the conductive layer 51 that correspond to the first-direction wiring lines 21 and the second-direction wiring lines 22 are exposed.

Referring to FIG. 11A, an insulating material may remain at the bottom of the trenches 54a in the insulating layer 54. Therefore, the remaining insulating material is removed by a wet process using a permanganate solution or an organic solvent, such as N-Methyl-2-pyrrolidone, or a dry process using an oxygen plasma. By removing the remaining insulating material as described above, the trenches 54a at which the conductive layer 51 is exposed are formed as illustrated in FIG. 11A.

Next, as illustrated in FIG. 11B, the trenches 54a in the insulating layer 54 are filled with a conductor 55. In the present embodiment, the trenches 54a in the insulating layer 54 are filled with copper by electroplating by using the conductive layer 51 as a seed layer.

Next, as illustrated in FIG. 11C, the insulating layer 54 is removed. The insulating layer 54 on the substrate 11 is removed by a wet process using a permanganate solution or an organic solvent, such as N-Methyl-2-pyrrolidone, or a dry process using an oxygen plasma.

Next, as illustrated in FIG. 11D, the conductive layer 51 and the adhesion enhancing layer 16 on the front surface of the substrate 11 are removed. The conductive layer 51 and the adhesion enhancing layer 16 are etched so that the front surface of the substrate 11 is exposed by a wet process using a copper etching solution, such as an aqueous solution of ferric chloride, an aqueous solution of cupric chloride, an aqueous solution of ammonium peroxodisulfate, an aqueous solution of sodium peroxodisulfate, sulfuric acid, or aqueous hydrogen peroxide.

After that, as illustrated in FIG. 11E, the protective layer 17 is formed to cover the highly adhesive layer 15, the conductor 55, and the adhesion enhancing layer 16 on the substrate 11. The protective layer 17 may be formed by, for example, roll coating, gravure coating, gravure reverse coating, micro gravure coating, slot die coating, die coating, knife coating, inkjet coating, dispenser coating, kiss coating, spray coating, screen printing, offset printing, or flexographic printing.

Thus, the wiring board 10 including the substrate 11 and the wiring pattern regions 20 arranged on the substrate 11 is obtained (FIG. 11E). The wiring pattern regions 20 each include the first-direction wiring lines 21 and the second-direction wiring lines 22. The above-described conductor 55 includes the first-direction wiring lines 21 and the second-direction wiring lines 22. The feeding unit 40 may be formed of a portion of the conductor 55. Alternatively, a flat plate-shaped feeding unit 40 may be separately prepared, and the thus-prepared feeding unit 40 may be electrically connected to the wiring pattern regions 20.

[Operations of Present Embodiment]

The operations of the wiring board having the above-described structure will now be described.

Figure 12:
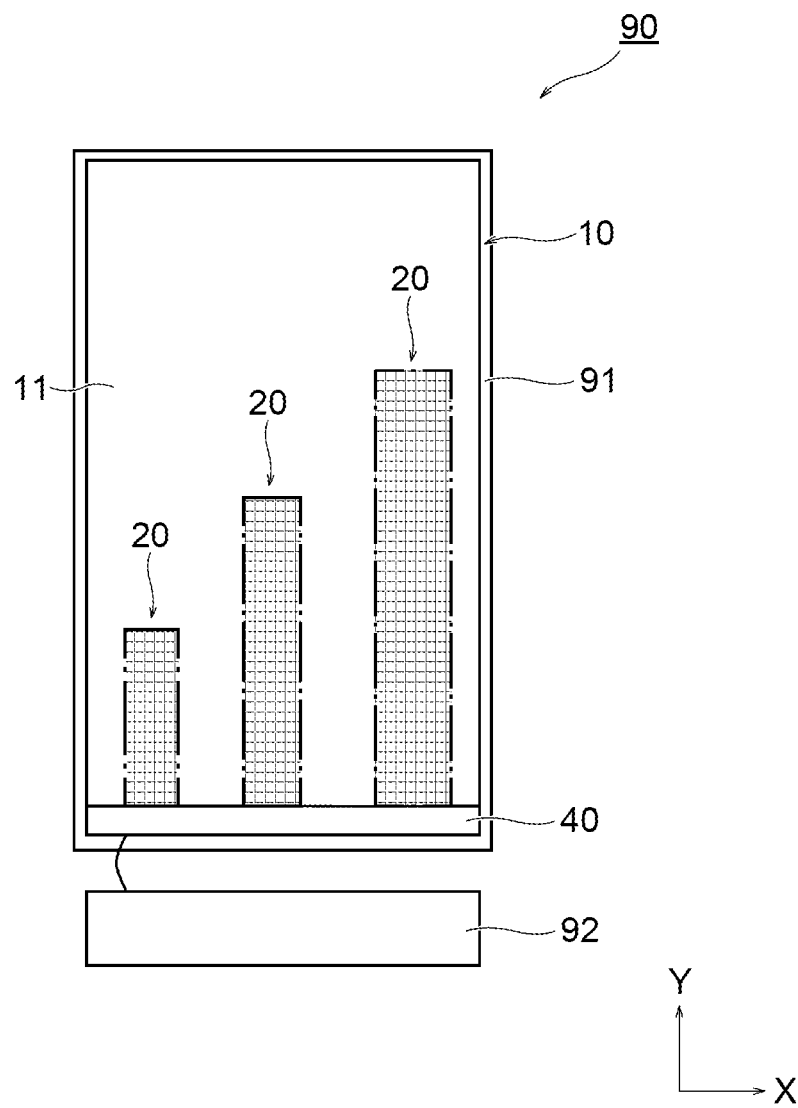
FIG. 12 is a plan view of an image display device according to an embodiment.

As illustrated in FIG. 12, the wiring board 10 is installed in the image display device 90 having the display 91. The wiring board 10 is disposed on the display 91. The image display device 90 may be, for example, a portable terminal device, such as a smartphone or a tablet. The wiring pattern regions 20 of the wiring board 10 are electrically connected to the wireless communication circuit 92 of the image display device 90 through the feeding unit 40. Thus, radio waves of predetermined frequencies can be transmitted and received through the wiring pattern regions 20. This enables communication using the image display device 90.

As described above, according to the present embodiment, each wiring pattern region 20 on the wiring board 10 has a sheet resistance of less than or equal to 5 Ω/sq, and the first-direction wiring lines 21 and the second-direction wiring lines 22 have a maximum width of less than or equal to 3 μm when viewed at a viewing angle of 120°. Accordingly, the visibility of the wiring pattern region 20 on the front surface of the display 91 can be reduced, so that the wiring pattern region 20 is not readily visible to the naked eye of the user of the image display device 90. In other words, since the width $W_a$ and the heights $H_1$ and $H_2$ of the wiring pattern region 20 can be minimized within the ranges in which the sheet resistance is less than or equal to 5 Ω/sq, the opening ratio At of the wiring pattern region 20 can be increased so that the wiring pattern region 20 is not readily visible. In addition, since the first-direction wiring lines 21 and the second-direction wiring lines 22 have a maximum width of less than or equal to 3 when viewed at a viewing angle of 120°, the first-direction wiring lines 21 and the second-direction wiring lines 22 are not readily visible to the user's naked eye.

In addition, according to the present embodiment, by setting the sheet resistance of each wiring pattern region 20 to less than or equal to 5 Ω/sq, the radiation efficiency of the wiring pattern region 20 alone can be set to greater than or equal to 75%. Thus, the performance of the wiring pattern region 20 as an antenna can be improved.

In addition, according to the present embodiment, each first-direction wiring line 21 has a cross section in which the smaller of the height $H_1$ and the line width $W_1$ of the first-direction wiring line 21 is less than or equal to twice the skin depth of the first-direction wiring line 21, and each second-direction wiring line 22 has a cross section in which the smaller of the height $H_2$ and the line width $W_2$ of the second-direction wiring line 22 is less than or equal to twice the skin depth of the second-direction wiring line 22. Accordingly, the first-direction wiring line 21 and the second-direction wiring line 22 can be efficiently utilized in cross sections thereof, and the cross-sectional areas thereof can be minimized. As a result, the opening ratio At of each wiring pattern region 20 can be increased so that the wiring pattern region 20 is not readily visible.

In addition, according to the present embodiment, since the highly adhesive layer 15 is formed on the substrate 11, the adhesion between the substrate 11 and each of the first-direction wiring lines 21 and the second-direction wiring lines 22 can be increased. In addition, since the adhesion enhancing layer 16 is formed on the highly adhesive layer 15, the adhesion between the substrate 11 and each of the first-direction wiring lines 21 and the second-direction wiring lines 22 can be further enhanced.

In addition, according to the present embodiment, the protective layer 17 is formed on the substrate 11 so as to cover the first-direction wiring lines 21 and the second-direction wiring lines 22. Therefore, the first-direction wiring lines 21 and the second-direction wiring lines 22 can be protected from, for example, external impacts.

In addition, according to the present embodiment, each wiring pattern region 20 has a function of an antenna. The wiring pattern region 20 that functions as an antenna can be disposed on the outermost surface of the image display device 90. Therefore, the communication performance is higher than when an antenna is mounted in the image display device 90. In addition, since a plurality of wiring pattern regions 20 that function as antennas can be arranged along the surface of the image display device 90, the communication performance can be improved.

(Modifications)

Modifications of the wiring board will now be described.

(First Modification)

Figure 13:
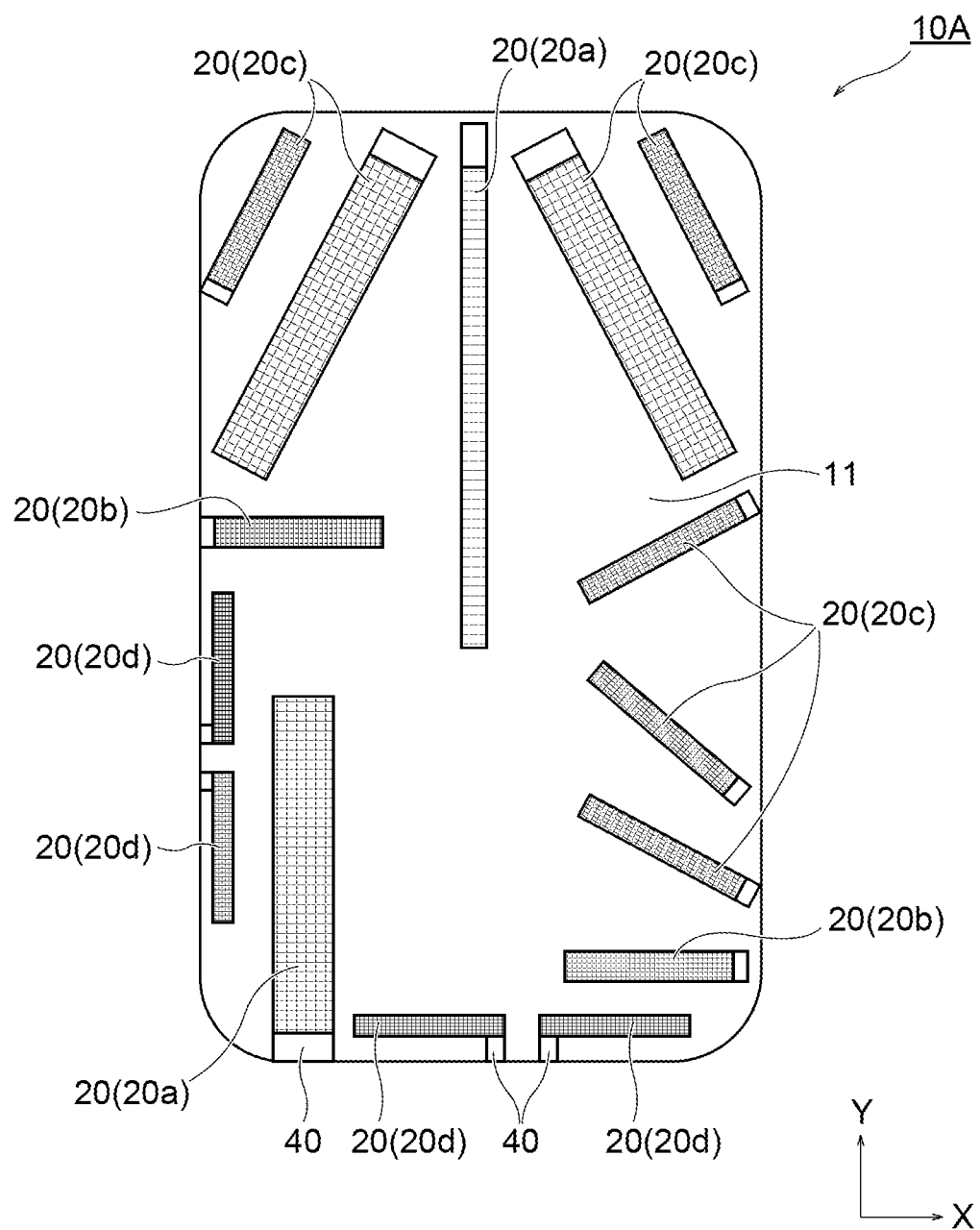
FIG. 13 is a plan view of a wiring board according to a first modification.

FIG. 13 illustrates a first modification of the wiring board. The modification illustrated in FIG. 13 differs from the above-described embodiment illustrated in FIGS. 1 to 12 in the structures of the wiring pattern regions 20, and other structures are substantially the same as those of the above-described embodiment. In FIG. 13, portions that are the same as those illustrated in FIGS. 1 to 12 are denoted by the same reference signs, and detailed description thereof is omitted.

A wiring board 10A illustrated in FIG. 13 includes a substrate 11 and a plurality of wiring pattern regions 20 (20a to 20d) arranged on the substrate 11. Some wiring pattern regions 20 have longitudinal directions different from those of other wiring pattern regions 20. More specifically, some of the wiring pattern regions 20 (20a and 20b) each have a longitudinal direction that is parallel to a side of the substrate 11 (X direction or Y direction). Other wiring pattern regions 20 (20c) each have a longitudinal direction that is not parallel to (is at an angle relative to) the sides of the substrate 11 (X direction and Y direction). Still other wiring pattern regions 20 (20d) are arranged axisymmetrically in pairs to form a dipole antenna.

In general, the wiring pattern regions 20 that receive radio waves in frequency bands with higher frequencies have shorter lengths. Therefore, the number of wiring pattern regions 20 arranged on the substrate 11 can be increased. However, the wiring pattern regions 20 that receive radio waves in frequency bands with higher frequencies tend to function as antennas with lower directivities. The reductions in directivities can be compensated for by arranging wiring pattern regions 20 oriented in various directions on the substrate 11.

(Second Modification)

Figure 14A:
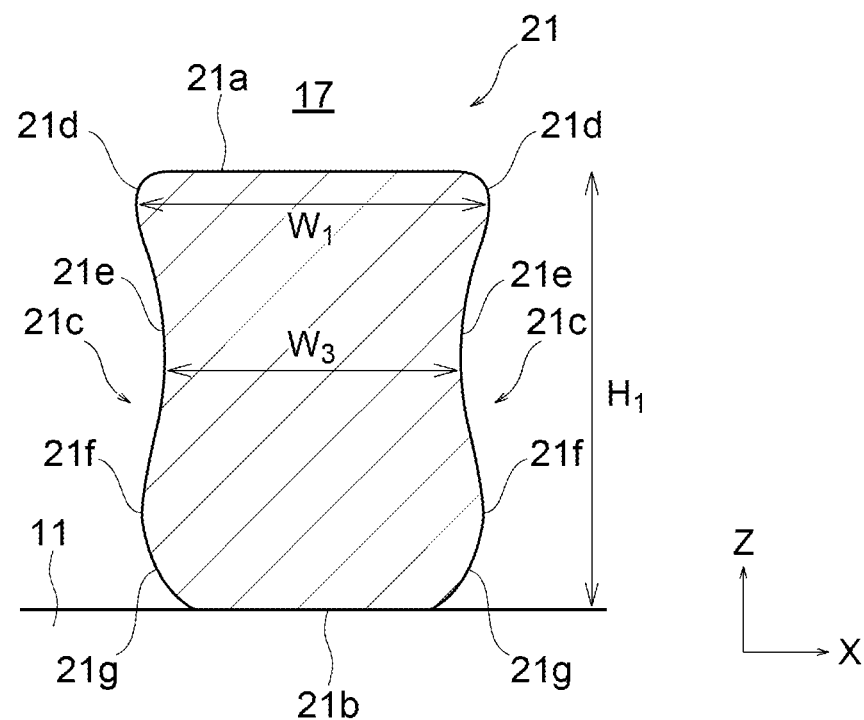
FIGS. 14A and 14B are sectional views of wiring lines on a wiring board according to a second modification.
Figure 14B:
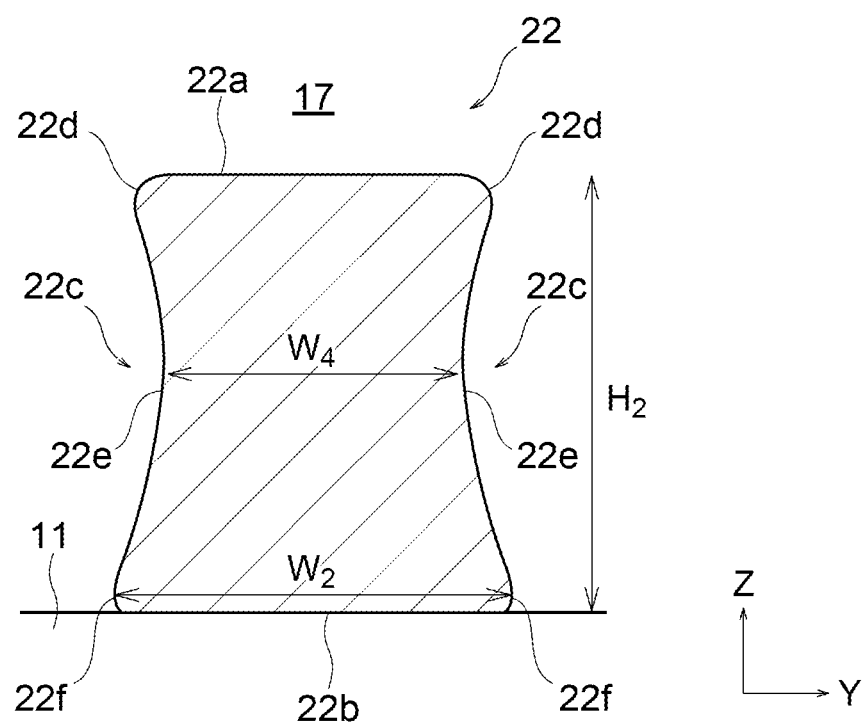

FIGS. 14A and 14B illustrate a second modification of the present disclosure. FIG. 14A is a sectional view of a first-direction wiring line 21 taken perpendicular to the longitudinal direction thereof, and FIG. 14B is a sectional view of a second-direction wiring line 22 taken perpendicular to the longitudinal direction thereof. The modification illustrated in FIGS. 14A and 14B differs from the above-described embodiment illustrated in FIGS. 1 to 12 in the shapes of the first-direction wiring line 21 and the second-direction wiring line 22, and other structures are substantially the same as those of the above-described embodiment. In FIGS. 14A and 14B, portions that are the same as those in the embodiment illustrated in FIGS. 1 to 12 are denoted by the same reference signs, and detailed description thereof is omitted.

As illustrated in FIG. 14A, the first-direction wiring line 21 includes a top surface 21a, a bottom surface 21b, and a pair of side surfaces 21c located between the top surface 21a and the bottom surface 21b. The top surface 21a is located at a side opposite to the side adjacent to the substrate 11, and the bottom surface 21b is located at the side adjacent to the substrate 11. The top surface 21a and the bottom surface 21b are located on planes that are substantially parallel to the main surface of the substrate 11. The pair of side surfaces 21c are located at both sides of the first-direction wiring line 21 (positive and negative sides in the X direction).

Each side surface 21c includes a top-side projecting portion 21d, an intermediate recessed portion 21e, an intermediate projecting portion 21f, and a bottom-side curved portion 21g, which are arranged in that order from the top surface 21a to the bottom surface 21b. The top-side projecting portion 21d, which is located adjacent to the top surface 21a, projects outward in the width direction of the first-direction wiring line 21 (X direction). The intermediate recessed portion 21e is curved inward with respect to the top-side projecting portion 21d in the width direction of the first-direction wiring line 21. The intermediate projecting portion 21f projects outward with respect to the intermediate recessed portion 21e in the width direction of the first-direction wiring line 21. The bottom-side curved portion 21g, which is located adjacent to the bottom surface 21b of the first-direction wiring line 21, is curved inward in the width direction so that the width of the first-direction wiring line 21 decreases from the intermediate projecting portion 21f toward the bottom surface 21b.

Since the intermediate recessed portion 21e is recessed inward in the width direction of the first-direction wiring line 21, the adhesion between the first-direction wiring line 21 and the protective layer 17 can be increased, so that the protective layer 17 is not easily separated from the first-direction wiring line 21. In addition, since a portion of the first-direction wiring line 21 that is adjacent to the bottom surface 21b (bottom-side curved portion 21g) is curved so that the width of the first-direction wiring line 21 decreases toward the bottom surface 21b, the first-direction wiring line 21 is not readily visible to the user's naked eyes. The intermediate recessed portion 21e and the bottom-side curved portion 21g may instead be provided only on one of the pair of side surfaces 21c.

In this case, a line width $W_1$ of the first-direction wiring line 21 is defined as the width of the widest portion of the first-direction wiring line 21. More specifically, the line width $W_1$ of the first-direction wiring line 21 is defined as the width of the first-direction wiring line 21 at the top-side projecting portions 21d. The line width $W_1$ of the first-direction wiring line 21 may be selected from the range of greater than or equal to 0.1 µm and less than or equal to 3.0 µm. The first-direction wiring line 21 is narrowest at the intermediate recessed portions 21e, and a line width $W_3$ of the first-direction wiring line 21 at the intermediate recessed portions 21e may be greater than or equal to 0.08 µm and less than or equal to 2.6 µm. A height $H_1$ of the first-direction wiring line 21 may be selected from the range of, for example, greater than or equal to 0.1 µm and less than or equal to 3.0 µm.

The aspect ratio ($W_1/H_1$) of the first-direction wiring line 21 may be greater than or equal to 0.5, and is preferably greater than or equal to 1.0. By increasing the aspect ratio of the first-direction wiring line 21, the first-direction wiring line 21 can be made less visible to the naked eye when viewed from the front (from the positive side in the Z direction), and the cross-sectional area of the first-direction wiring line 21 can be increased to reduce the resistance of the first-direction wiring line 21. This results in greater invisibility and higher performance (lower resistance) of the first-direction wiring line 21.

As illustrated in FIG. 14B, the second-direction wiring line 22 includes a top surface 22a, a bottom surface 22b, and a pair of side surfaces 22c located between the top surface 22a and the bottom surface 22b. The top surface 22a is located at a side opposite to the side adjacent to the substrate 11, and the bottom surface 22b is located at the side adjacent to the substrate 11. The top surface 22a and the bottom surface 22b are located on planes that are substantially parallel to the main surface of the substrate 11. The pair of side surfaces 22c are located at both sides of the second-direction wiring line 22 (positive and negative sides in the Y direction).

Each side surface 22c includes a top-side projecting portion 22d, an intermediate recessed portion 22e, and a bottom-side tapered portion 22f, which are arranged in that order from the top surface 22a to the bottom surface 22b. The top-side projecting portion 22d, which is located adjacent to the top surface 22a, projects outward in the width direction of the second-direction wiring line 22 (Y direction). The intermediate recessed portion 22e is curved inward with respect to the top-side projecting portion 22d in the width direction of the second-direction wiring line 22. The bottom-side tapered portion 22f, which is located adjacent to the bottom surface 22b of the second-direction wiring line 22, is a tapered surface that is tapered such that the width of the second-direction wiring line 22 increases from the intermediate recessed portion 22e toward the bottom surface 22b.

Since the intermediate recessed portion 22e is recessed inward in the width direction of the second-direction wiring line 22, the adhesion between the second-direction wiring line 22 and the protective layer 17 can be increased, so that the protective layer 17 is not easily separated from the second-direction wiring line 22. In addition, since each side surface 22c includes the tapered surface (bottom-side tapered portion 22f) in a region adjacent to the bottom surface 22b, the adhesion between the second-direction wiring line 22 and the substrate 11 can be increased. The intermediate recessed portion 22e and the tapered surface (bottom-side tapered portion 22f) may instead be provided only on one of the pair of side surfaces 22c.

In this case, a line width $W_2$ of the second-direction wiring line 22 is defined as the width of the widest portion of the second-direction wiring line 22. More specifically, the line width $W_2$ of the second-direction wiring line 22 is defined as the width of the second-direction wiring line 22 at the bottom-side tapered portions 22f. The line width $W_2$ of the second-direction wiring line 22 may be selected from the range of greater than or equal to 0.1 µm and less than or equal to 3.0 µm. The second-direction wiring line 22 is narrowest at the intermediate recessed portions 22e, and a line width $W_4$ of the second-direction wiring line 22 at the intermediate recessed portions 22e may be in the range of greater than or equal to 0.08 µm and less than or equal to 2.6 µm. A height $H_2$ of the second-direction wiring line 22 may be selected from the range of, for example, greater than or equal to 0.1 µm and less than or equal to 3.0 µm.

The aspect ratio ($W_2/H_2$) of the second-direction wiring line 22 may be greater than or equal to 0.5, and is preferably greater than or equal to 1.0. By increasing the aspect ratio of the second-direction wiring line 22, the second-direction wiring line 22 can be made less visible to the naked eye when viewed from the front (from the positive side in the Z direction), and the cross-sectional area of the second-direction wiring line 22 can be increased to reduce the resistance of the second-direction wiring line 22. This results in greater invisibility and higher performance (less resistance) of the second-direction wiring line 22.

The cross-sectional shapes of the first-direction wiring line 21 and the second-direction wiring line 22 illustrated in FIGS. 14A and 14B are formed by etching. More specifically, the shapes of the first-direction wiring line 21 and the second-direction wiring line 22 (for example, the shapes of the side surfaces and the curved surfaces) can be adjusted by appropriately setting, for example, the etching conditions (type and concentration of the etching solution and etching time) under which the conductive layer 51 and the adhesion enhancing layer 16 (see FIG. 11D) are etched.

As described above, according to the present modification, the first-direction wiring line 21 and the second-direction wiring line 22 have different cross-sectional shapes. More specifically, the first-direction wiring line 21 is shaped such that portions of the pair of side surfaces 21c that are adjacent to the bottom surface 21b are curved so that the width of the first-direction wiring line 21 decreases toward the bottom surface 21b, and the second-direction wiring line 22 is shaped such that portions of the pair of side surfaces 22c that are adjacent to the bottom surface 22b are tapered.

Accordingly, the first-direction wiring line 21 can be made less visible to the naked eye when viewed from the front (from the positive side in the Z direction), and the adhesion between the second-direction wiring line 22 and the substrate 11 can be increased.

The image display device 90 including the display 91 (see FIG. 12) on which the wiring board 10 is disposed has a standard use orientation, and the wiring pattern regions 20 are preferably not readily visible when the image display device 90 is used in this orientation. The cross-sectional shapes of each first-direction wiring line 21 and each second-direction wiring line 22 are preferably set so that the wiring pattern regions 20 are not readily visible in the standard use orientation and that the adhesion between each wiring pattern region 20 and the substrate 11 is increased. Therefore, the cross-sectional shapes of each first-direction wiring line 21 and each second-direction wiring line 22 may be reversed from those in the above-described example depending on the standard use orientation. For example, each first-direction wiring line 21 may have the cross-sectional shape illustrated in FIG. 14B, and each second-direction wiring line 22 may have the cross-sectional shape illustrated in FIG. 14A.

When the first-direction wiring lines 21 of each wiring pattern region 20 function as an antenna, the function of the entire wiring pattern region 20 can be improved by setting the pitch of the first-direction wiring lines 21 to be less than the pitch of the second-direction wiring lines 22. In this case, when the cross-sectional shapes of each first-direction wiring line 21 and each second-direction wiring line 22 are as illustrated in FIGS. 14A and 14B, the visibility of the first-direction wiring lines 21 can be reduced and the adhesion between each second-direction wiring line 22 and the substrate 11 can be increased.

It is not necessary that each first-direction wiring line 21 and each second-direction wiring line 22 have different cross-sectional shapes. For example, each second-direction wiring line 22 may have the same cross-sectional shape as that of each first-direction wiring line 21. In addition, it is not necessary that the aspect ratio of each first-direction wiring line 21 and the aspect ratio of each second-direction wiring line 22 both be greater than or equal to 0.5. For example, each first-direction wiring line 21 or each second-direction wiring line 22 may have an aspect ratio of less than 0.5.

The highly adhesive layer 15 and the adhesion enhancing layer 16 are not illustrated in FIGS. 14A and 14B. This also applies to FIGS. 15A and 15B described below.

(Third Modification)

Figure 15A:
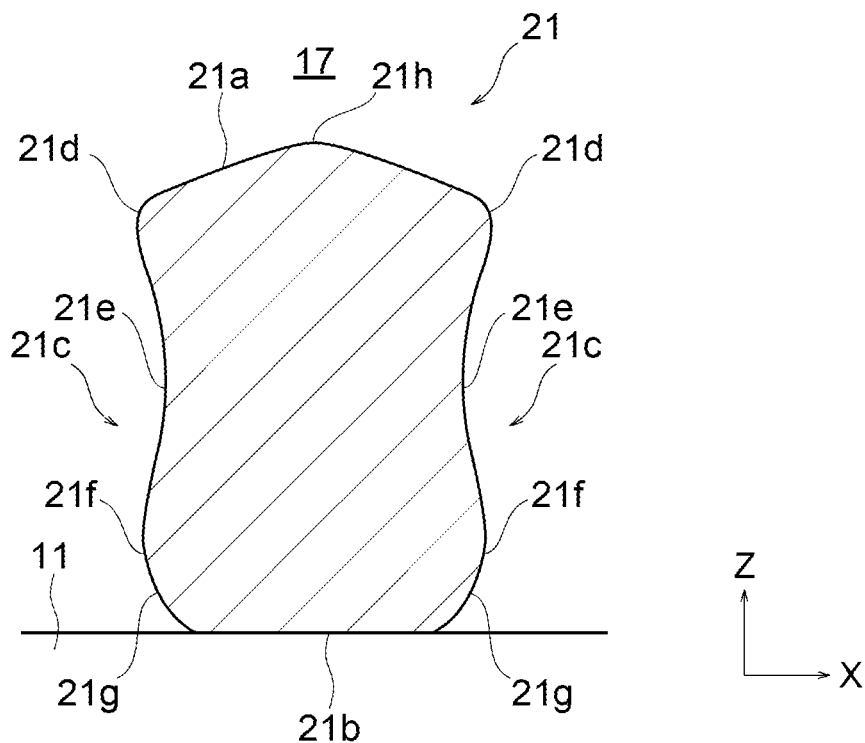
FIGS. 15A and 15B are sectional views of wiring lines on a wiring board according to a third modification.
Figure 15B:
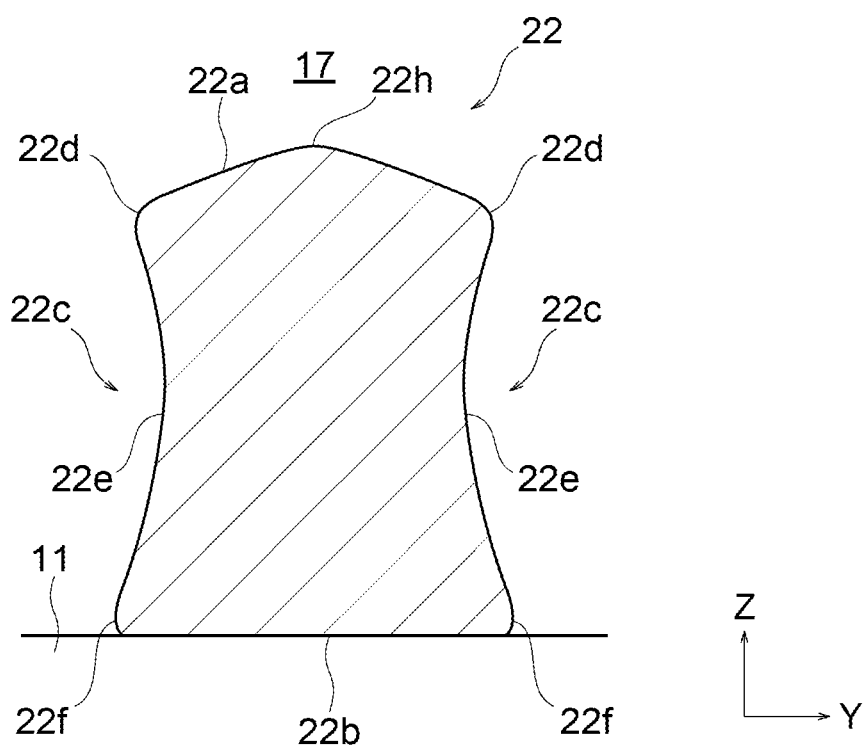

FIGS. 15A and 15B illustrate a third modification of the present disclosure. FIG. 15A is a sectional view of a first-direction wiring line 21 taken perpendicular to the longitudinal direction thereof, and FIG. 15B is a sectional view of a second-direction wiring line 22 taken perpendicular to the longitudinal direction thereof. The modification illustrated in FIGS. 15A and 15B differs from the above-described second modification illustrated in FIGS. 14A and 14B in cross-sectional shapes of the first-direction wiring line 21 and the second-direction wiring line 22, and other structures are substantially the same as those of the above-described second modification. In FIGS. 15A and 15B, portions that are the same as those in the embodiment illustrated in FIGS. 1 to 14 are denoted by the same reference signs, and detailed description thereof is omitted.

As illustrated in FIG. 15A, the first-direction wiring line 21 includes a top surface 21a having a projection 21h. The projection 21h projects upward toward the front side (in a direction away from the substrate 11). The projection 21h is located in a substantially central region in the width direction of the first-direction wiring line 21.

As illustrated in FIG. 15B, the second-direction wiring line 22 includes a top surface 22a having a projection 22h. The projection 22h projects upward toward the front side (in a direction away from the substrate 11). The projection 22h is located in a substantially central region in the width direction of the second-direction wiring line 22.

Since the top surface 21a of the first-direction wiring line 21 and the top surface 22a of the second-direction wiring line 22 have projections 21h and 22h, respectively, the adhesion between the first-direction wiring line 21 and the protective layer 17 and between the second-direction wiring line 22 and the protective layer 17 can be increased, and the protective layer 17 is not easily separated from the first-direction wiring line 21 or the second-direction wiring line 22. In addition, the cross-sectional areas of the first-direction wiring line 21 and the second-direction wiring line 22 can be increased to reduce the resistances of the first-direction wiring line 21 and the second-direction wiring line 22.

The first-direction wiring line 21 and the second-direction wiring line 22 may instead be formed such that only one thereof has the projection 21h or 22h.

Although the wiring pattern regions 20 function as antennas in the examples described above with reference to FIGS. 1 to 15, the wiring pattern regions 20 are not limited to this. The wiring pattern regions 20 may instead have functions of, for example, hovering (function for enabling operation by the user without direct contact with a display), fingerprint authentication, heating, or noise filtering (shielding). Also in this case, when the wiring pattern regions 20 have a sheet resistance of less than or equal to 5 $\Omega$/sq and when the first-direction wiring lines 21 and the second-direction wiring lines 22 have a maximum width of less than or equal to 3 μm when viewed at a viewing angle of 120°, the visibility of the wiring pattern regions 20 can be reduced, so that the wiring pattern regions 20 are not readily visible to the user's naked eye.

The components of the above-described embodiment and modifications may be applied in combination with each other as necessary. Also, some of the components of the above-described embodiment and modifications may be omitted.

The invention claimed is:

1. A wiring board comprising:
   a substrate that is transparent; and
   a wiring pattern region that is disposed on the substrate and that includes a plurality of wiring lines,
   wherein the wiring pattern region has a sheet resistance of less than or equal to 5 $\Omega$/sq, and
   wherein each wiring line has a maximum width of less than or equal to 3 μm when viewed at a viewing angle of 120°.

2. The wiring board according to claim 1, wherein each wiring line has a cross section in which a smaller of a height and a line width of the wiring line is less than or equal to twice a skin depth of the wiring line.

3. The wiring board according to claim 1, wherein at least one of the wiring lines has an aspect ratio of greater than or equal to 0.5.

4. The wiring board according to claim 1, wherein the wiring lines each include a top surface, a bottom surface, and a pair of side surfaces located between the top surface and the bottom surface, and
   wherein the pair of side surfaces of at least one of the wiring lines are curved so that a width of the at least one of the wiring lines decreases toward the bottom surface in a region adjacent to the bottom surface.

5. The wiring board according to claim 1, wherein the wiring lines each include a top surface, a bottom surface, and a pair of side surfaces located between the top surface and the bottom surface,
  wherein the pair of side surfaces of at least one of the wiring lines are curved so that a width of the at least one of the wiring lines decreases toward the bottom surface in a region adjacent to the bottom surface, and
  wherein at least one of the pair of side surfaces of at least another one of the wiring lines is tapered in a region adjacent to the bottom surface.

6. The wiring board according to claim 1, wherein the wiring lines each include a top surface, a bottom surface, and a pair of side surfaces located between the top surface and the bottom surface, and
  wherein the top surface of at least one of the wiring lines projects in a direction away from the substrate.

7. The wiring board according to claim 1, wherein a highly adhesive layer is formed on the substrate.

8. The wiring board according to claim 7, wherein an adhesion enhancing layer is formed on the highly adhesive layer.

9. The wiring board according to claim 1, wherein a protective layer is formed on the substrate so as to cover the wiring lines.

10. The wiring board according to claim 1, wherein the wiring pattern region has a function of an antenna.

11. The wiring board according to claim 1, wherein a plurality of the wiring pattern regions are provided, and a longitudinal direction of one or more of the wiring pattern regions differs from a longitudinal direction of another one or more of the wiring pattern regions.

12. A method for manufacturing a wiring board, the method comprising:
  a step of preparing a substrate that is transparent; and
  a step of forming a wiring pattern region including a plurality of wiring lines on the substrate,
  wherein the wiring pattern region has a sheet resistance of less than or equal to 5 $\Omega$/sq, and
  wherein each wiring line has a maximum width of less than or equal to 3 μm when viewed at a viewing angle of 120°.

* * * * *